(12) United States Patent
Chung et al.

(10) Patent No.: US 9,588,417 B2
(45) Date of Patent: Mar. 7, 2017

(54) PHOTOMASK PELLICLE

(71) Applicant: Taiwan Semiconductor Manufacturing Company, Ltd., Hsin-Chu (TW)

(72) Inventors: Chia-Chun Chung, Hsin-Chu (TW); Chia-Hao Hsu, Hsinchu (TW); Chih-Tsung Shih, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 65 days.

(21) Appl. No.: 14/724,397

(22) Filed: May 28, 2015

(65) Prior Publication Data

US 2016/0349609 A1    Dec. 1, 2016

(51) Int. Cl.
G03F 1/64 (2012.01)
G03F 1/62 (2012.01)
G03F 1/50 (2012.01)
G03F 1/76 (2012.01)
G03F 1/80 (2012.01)

(52) U.S. Cl.
CPC ............... G03F 1/62 (2013.01); G03F 1/50 (2013.01); G03F 1/76 (2013.01); G03F 1/80 (2013.01)

(58) Field of Classification Search
CPC .................................... G03F 1/62; G03F 1/64
See application file for complete search history.

(56) References Cited

U.S. PATENT DOCUMENTS

| | | |
|---|---|---|
| 5,042,655 A | 8/1991 | Beldyk et al. |
| 8,628,897 B1 | 1/2014 | Lu et al. |
| 8,679,707 B2 | 3/2014 | Lee et al. |
| 8,691,476 B2 | 4/2014 | Yu et al. |
| 8,709,682 B2 | 4/2014 | Chen et al. |
| 8,715,890 B2 | 5/2014 | Tu et al. |
| 8,722,286 B2 | 5/2014 | Yu et al. |
| 8,753,788 B1 | 6/2014 | Yu et al. |
| 8,764,995 B2 | 7/2014 | Chang et al. |
| 8,765,330 B2 | 7/2014 | Shih et al. |
| 8,765,582 B2 | 7/2014 | Hsu et al. |
| 8,785,084 B2 | 7/2014 | Lu et al. |
| 8,828,625 B2 | 9/2014 | Lu et al. |
| 8,841,047 B2 | 9/2014 | Yu et al. |
| 8,877,409 B2 | 11/2014 | Hsu et al. |
| 2005/0025959 A1* | 2/2005 | Bellman ............... C23C 14/48 428/336 |

FOREIGN PATENT DOCUMENTS

CN    101876786    11/2010

* cited by examiner

Primary Examiner — Stephen Rosasco
(74) Attorney, Agent, or Firm — Haynes and Boone, LLP

(57) ABSTRACT

A method includes providing a carrier wafer, forming an indented portion on the carrier wafer, the indented portion having a sloped portion at an edge of the indented portion, bonding a pellicle wafer on the carrier wafer so as to form an open area within the indented portion, patterning the pellicle wafer to form a pellicle membrane over the indented portion and a pellicle membrane support structure over the sloped portion, and applying a mechanical force to disconnect the pellicle membrane from the pellicle wafer.

20 Claims, 8 Drawing Sheets

PHOTOMASK PELLICLE

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

Photolithography processes typically form a patterned resist layer for various patterning processes, such as etching or ion implantation. In the photolithography process, a photomask (or mask) is used. The mask includes a substrate and a patterned layer that defines an integrated circuit to be transferred to a semiconductor substrate during the photolithography process. During the formation of the mask or the photolithography process utilizing the mask, various mask contaminants, such as chemical contaminants, are introduced and are hard to remove. The current cleaning methods do not efficiently remove the mask contaminants and may further damage the mask.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
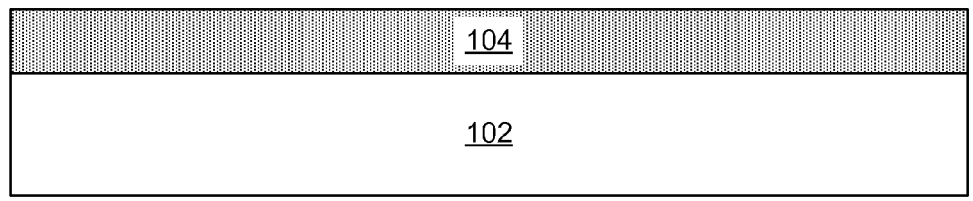
FIGS. 1A-1K are diagrams showing an illustrative process for forming a pellicle on a photomask, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures.

The apparatus may be otherwise oriented (rotated 90 degrees or at other orientations) and the spatially relative descriptors used herein may likewise be interpreted accordingly.

As described above, during the formation of the mask or the photolithography process utilizing the mask, various mask contaminants, such as chemical contaminants, are introduced and are hard to remove. According to the present example, a pellicle is formed to protect the mask. Specifically, a pellicle is formed into a wafer and then bonded to a pellicle frame that is connected to a mask. Then, the pellicle is mechanically disconnected from the wafer into which it was formed.

FIGS. 1A-1K are diagrams showing an illustrative process for forming a pellicle on a photomask. According to the present example, FIG. 1A illustrates a spacing layer 104 that is formed on a carrier wafer 102. The carrier wafer 102 is a sacrificial structure used to support another layer, in this case, the spacing layer 104 and subsequently formed layers that will be described in further detail below. The carrier wafer 102 may be circular. The carrier wafer 102 may be made of a semiconductor material or other suitable material.

The spacing layer 104 may be deposited onto the carrier wafer 102 using a high density plasma Chemical Vapor Deposition (CVD) process. In one example, the spacing layer 104 may have a thickness that is greater than 500 nanometers. In one example, the spacing layer 104 may have a thickness within a range of about 500 to 600 nanometers. The spacing layer 104 may be made of a material such as silicon nitride or silicon oxynitride. Such material may be patterned to create a desired structure as will be described in further detail below.

Figure 1B:
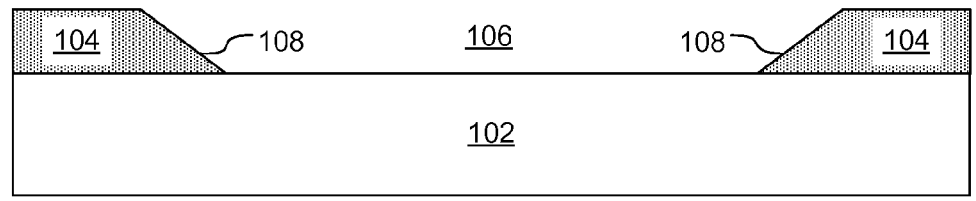

FIG. 1B illustrates a patterning process performed on the spacing layer 104. The patterning process may be performed using photolithographic processes and etching processes. Such etching processes may involve a combination of wet etching and dry etching to achieve the desired profile. As illustrated the spacing layer 104 is patterned to form an indented portion 106. In the present example, the indented portion 106 is formed by removing the spacing layer 104 entirely to expose the underlying carrier wafer 102. The edges of the indented portion 106 are formed to have sloped portions 108.

The profile of the sloped portions 108 can be achieved using various combinations of wet etching and dry etching. Wet etching uses chemical etchants to remove material. Wet etching is isotropic and thus will generally etch in all directions. Dry etching, such as plasma etching, involves a bombardment of ions to remove material. Dry etching is anisotropic and thus etches primarily in a single direction. In the present example, the sloped portions 108 are substantially linear. In some examples, however, the sloped portions 108 may have other forms. For example, the sloped portions may be slightly convex or slightly concave. In some cases, only parts of the sloped portions 108 may be convex or concave while other parts are substantially linear.

In the present example, the spacing layer 104 is removed to expose the underlying carrier wafer 102 when forming the indented portion 106. In some examples, however, the indented portion 106 may not extend to the carrier wafer 102. For example, the indented portion 106 may have a depth that is less than the thickness of the spacing layer 104. In some examples, instead of using a spacing layer 104, the indented portion 106 may be formed into the carrier wafer 102.

Figure 1C:
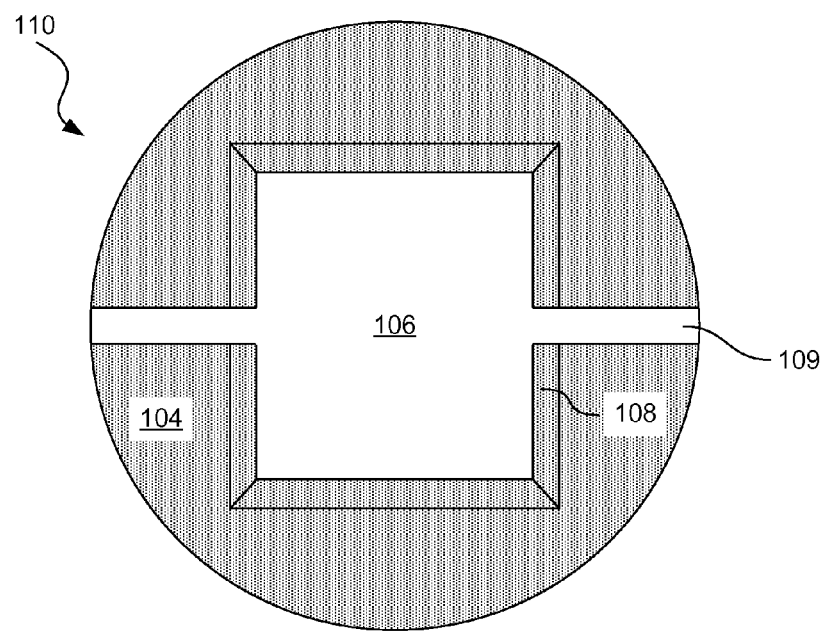

FIG. 1C is a top view 110 of the spacing layer 104. According to the present example, the indented portion 106 is rectangular in shape. Additionally, the sloped portions 108 are formed around all edges of the indented portion 106. The size of the rectangular indented portion 106 is based on the size of the photomask to which a pellicle is to be attached. In some examples, the size of the rectangular indented portion 106 is slightly bigger than the size of the patterned portion of a photomask. While FIG. 1C illustrates an example for a rectangular mask, other shapes are contemplated as well. For example, a particular photomask may be elliptical, circular, square, or have another shape. The indented portion 106 is designed to match such a shape.

The top view 110 also illustrates a groove that is patterned into the spacing layer 104. The groove 109 extends from the indented portion 106 to the edge of the carrier wafer 102. As will be described in further detail below, the groove 109 acts as an exhaust port to allow air within the indented portion 106 to escape out the sides of the carrier wafer 102. In the example where the indented portion 106 is formed into the carrier wafer 102 without use of the spacing layer 104, the groove 109 may also be formed into the carrier wafer 102.

Figure 1D:
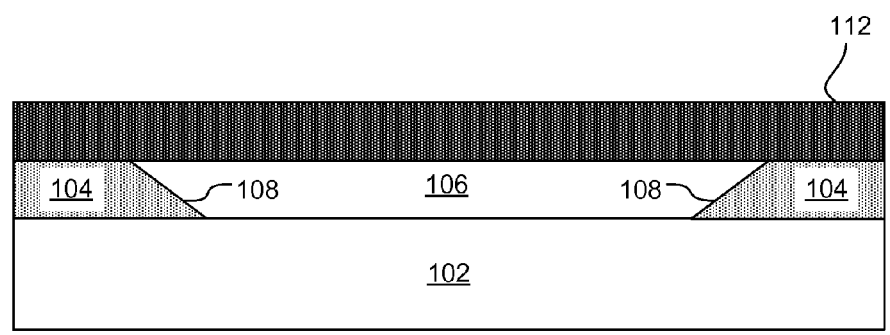

FIG. 1D illustrates a pellicle wafer 112 being bonded on the carrier wafer 102. Specifically, the pellicle wafer 112 is bonded to the spacing layer 104. In one example, the pellicle wafer 112 is formed of a semiconductor material such as silicon. The shape of the pellicle wafer 112 may be substantially similar to the shape of the carrier wafer 102.

In one example, the pellicle wafer 112 is bonded to the spacing layer 104 using a fusion bonding process. Such a bonding process may involve placing the pellicle wafer 112 against the spacing layer 104 and applying a high temperature and pressure. For example, a temperature within a range of about 200-500 degrees Celsius may be applied. The high temperature causes the material forming the pellicle wafer 112 to bond with the material forming the spacing layer 104.

Bonding the pellicle wafer 112 to the spacing layer 104 creates an open area within the indented portion 106. The open area, however, is not sealed due to the groove 109 that is formed within the spacing layer 104. In other words, the open area is in communication with the environment external to the illustrated apparatus. In the example where the indented portion 106 is formed into the carrier wafer 102 without use of the spacing layer 104, the pellicle wafer 112 is bonded directly to the carrier wafer 102.

Figure 1E:
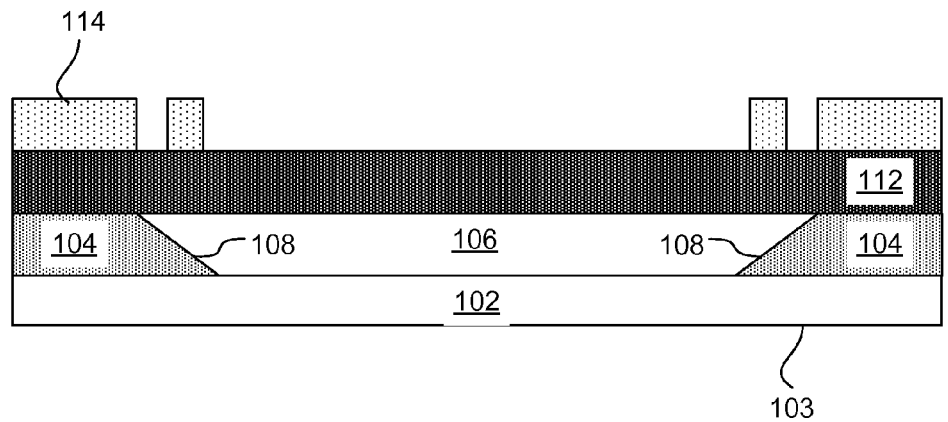

FIG. 1E illustrates the formation of a patterned resist layer 114. In one example, the resist layer 114 is coated onto the pellicle wafer 112. The resist layer is then patterned by a lithography process that includes an exposing process and a developing process. For example, the resist layer 114 is exposed to a light source through use of a patterned photomask. After exposure, certain portions of the resist layer are soluble to a developing solution. The developing solution thus removes the soluble portions leaving the patterned resist layer 114 illustrated in FIG. 1E.

In some examples, before applying the resist layer, the backside 103 of the carrier wafer 102 may be thinned down. In some cases, the combination of the carrier wafer 102, spacing layer 104, and the pellicle wafer 112 may be too thick to fit into some photolithography tools. Thus, the carrier wafer 102 may be thinned down to allow the wafers to fit within the tools that perform the photolithography processes.

Figure 1F:
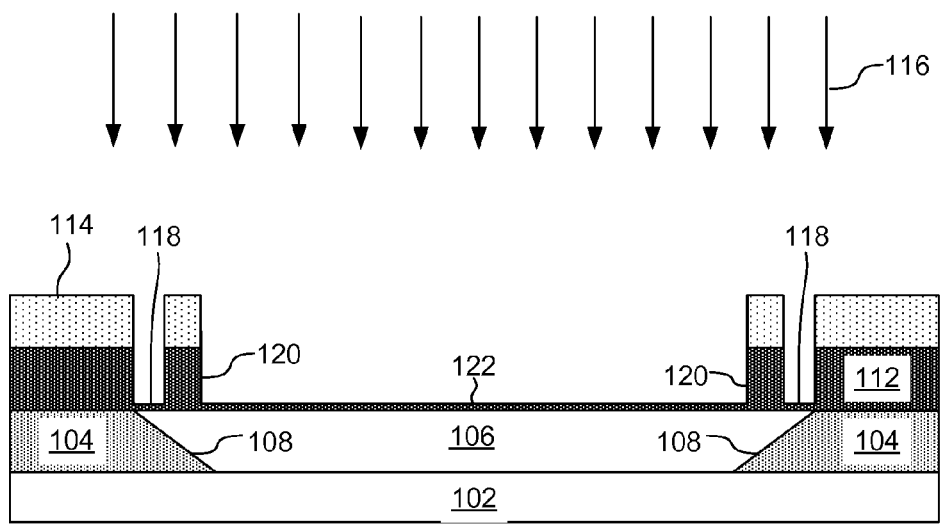

FIG. 1F illustrates an etching process 116. According to the present example, an etching process 116 is used to thin down the pellicle wafer 112 to form a variety of features. The etching process 116 may be an anisotropic etching process such as a dry etching process. The portions of the pellicle wafer 112 that are etched away are the portions that are exposed through the patterned resist layer 114.

Etching the pellicle wafer 112 through the exposed portions of the resist layer 114 creates a variety of features including the break-off part 118, the pellicle membrane support structure 120, and the pellicle membrane 122. The pellicle membrane 122 is formed over the indented portion 106. The pellicle membrane 122 is thin enough to be substantially transparent to whatever type of light is to be used with the photomask that is protected by the pellicle membrane 122, while also being mechanically strong enough to retain itself. In one example, the pellicle membrane 122 is less than 200 nanometers.

The pellicle membrane support structure 120 connects the pellicle membrane 122 to a photomask. More specifically, as will be described in further detail below, the pellicle membrane support structure 120 connects the pellicle membrane 122 to a pellicle frame that is attached to the photomask. From a top view perspective, the pellicle membrane support structure 120 is a circuitous structure that follows the rectangular shape of the indented portion 106.

The break-off part 118 is positioned between the pelican membrane support structure 120 and the remaining portions of the pellicle wafer 112. The break-off part 118 is the formed by forming a continuous trench that surrounds the pellicle membrane support structure 120. The break-off part 118 may be similar in thickness to the pellicle membrane 122. As will be described in further detail below, the break-off part 118 are designed to be broken under the application of mechanical pressure in order to disconnect the pellicle membrane 122 and pellicle membrane support structure 120 from the remaining portion of the pellicle wafer 112. Because the break-off part 118, pellicle membrane support structure 120, and pellicle membrane 122 are all formed within the same pellicle wafer 112, they form a single monolithic structure. In some examples, the break-off part is vertically aligned with the edge of the sloped portion 108.

Figure 1G:
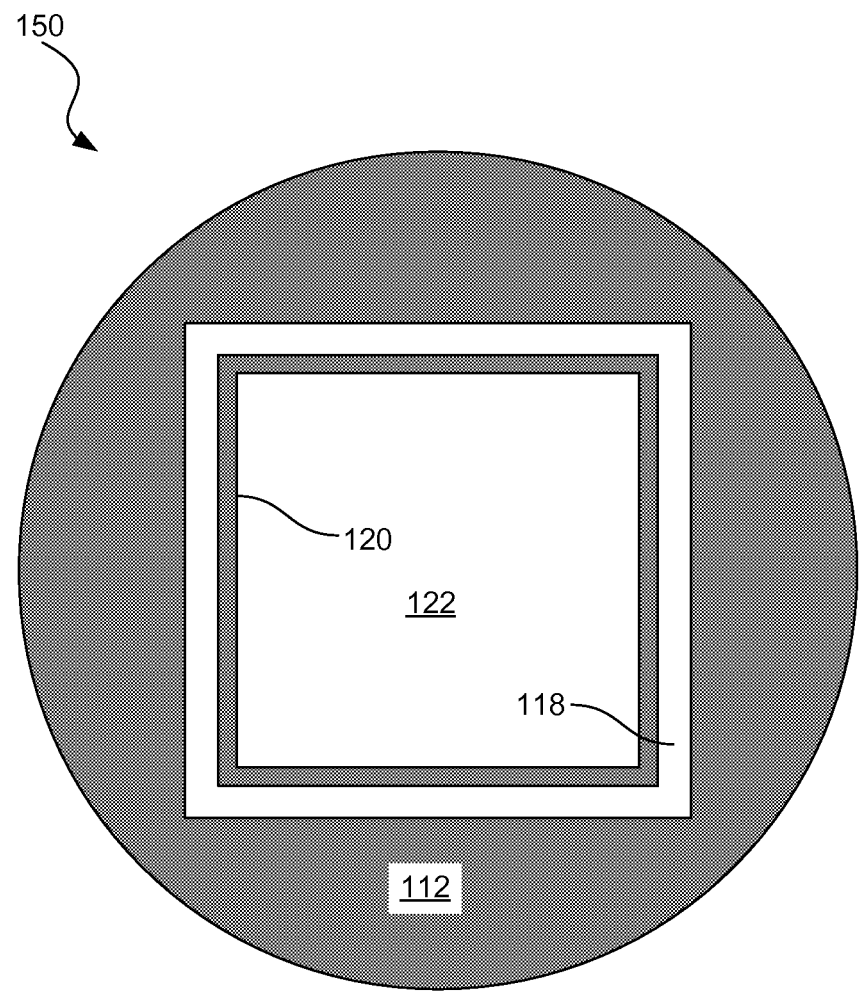

FIG. 1G is a diagram showing an illustrative top view 150 of the pellicle wafer 112 after being patterned. The top view 150 shows the pellicle membrane support structure 120 surrounding the pellicle membrane 122. A continuous trench separates the pellicle membrane support structure 120 from the remaining portion of the pellicle wafer 112. The trench forms the break-off part 118.

Figure 1H:
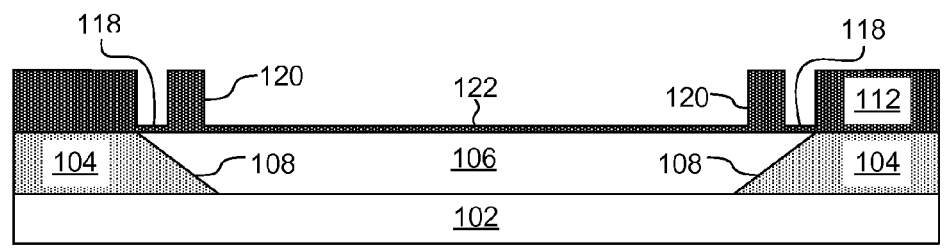

FIG. 1H is a diagram showing removal of the patterned resist layer 114. In one example, the patterned resist layer is removed using a wet etching process. Such a wet etching process may is selective so as to remove only the resist layer 114 while leaving the underlying pellicle wafer 112 substantially intact.

Additionally, FIG. 1H illustrates a photomask 124 before the photomask is connected to the pellicle. The photomask 124 includes a patterned side 125 and a pellicle frame 126. The patterned side 125 may also be referred to as the patterned portion. The patterned side 125 includes the actual pattern that is intended to be transferred onto a resist layer of a substrate (not shown) to manufacture an integrated circuit. The photomask 124 is a reflective mask. Thus, light from a light source is directed at the surface of the patterned size. Portions of the patterned side 125 will reflect that light and other portions will absorb that light. Thus, when the reflected light reaches a resist layer coated on a semiconductor wafer during a lithography exposing process, the pattern defined by the patterned side 125 will transfer to that resist layer.

The photomask 124 is relatively costly to manufacture. Moreover, the photomask 124 can be damaged by small particles and contaminants that will cause defects in the patterns formed through use of the photomask 124. Such damage is problematic because the defect may be transferred to thousands of wafers before being detected. While various cleaning processes may be used to remove such particles and contaminants, the cleaning process itself may cause damage to the photomask 124, particularly after repetitive cleaning cycles. Thus, it is desirable prevent such contaminants from reaching the patterned side 125 of the photomask 124.

The pellicle frame 126 may be secured to the photomask 124 in a variety of ways. For example, the pellicle frame 126 may be bonded to the photomask 124. The pellicle frame 126 may be made of a metal material such as aluminum or steel. From a top perspective, the pellicle frame 126 may form a circuitous structure that encompasses the patterned side 125 of the photomask 124. Additionally, the pellicle frame 126 may match the size and shape of the pellicle membrane support structure 120.

Figure 1I:
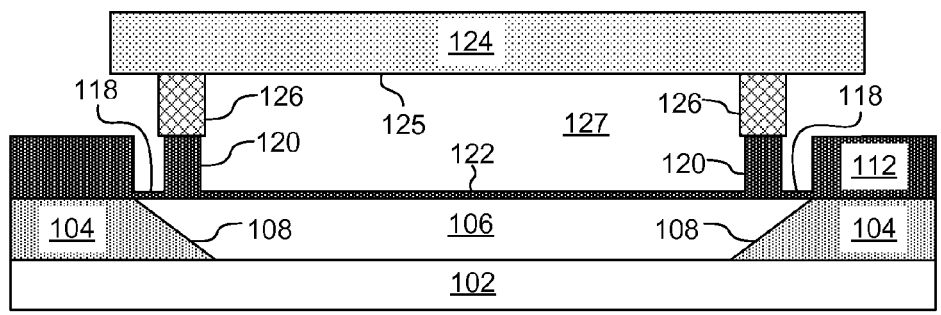

FIG. 1I illustrates the pellicle membrane support structure 120 bonded to the pellicle frame 126. In one example, the bonding may be achieved through use of silicon glue. As described above, both the pellicle membrane support structure 120 and the pellicle frame may have a matching circuitous structure. Thus, by bonding the pellicle membrane support structure 120 to the pellicle frame 126, a protected area 127 is formed around the patterned side 125 of the photomask 124.

Figure 1J:
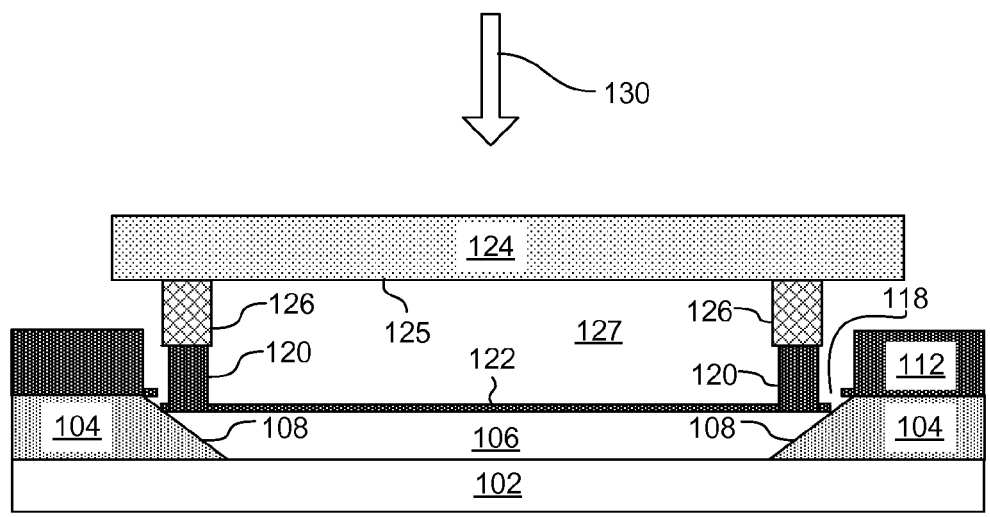

FIG. 1J illustrates a mechanical force 130 being applied to the photomask 124 in order to break the break-off part 118 and disconnect the pellicle membrane and pellicle membrane support structure 120 from the remaining portions of the pellicle wafer 112. The mechanical pressure may be applied in a variety of manners. For example, a tool may be used to press against the photomask 124 and press it downward. The mechanical force 130 is strong enough to break the break-off part 118 but not so strong as to damage the pellicle membrane 122 or pellicle membrane support structure 120.

The sloped portions 108 of the spacing layer 104 are used to help the break-off process. Specifically, the mechanical force 130 presses the break-off part 118 against the sloped portions 108. The width of the break-off part 118 and the slope of the sloped portions 108 can be tuned to effectively break the break-off part 118. Additionally, as described below, because the spacing layer 104 includes a groove (109, FIG. 1C), the air within the space within the indented portion 106 can be pushed out through the exhaust port created by the groove. This prevents pressure from being applied to the membrane 122. Such pressure may cause damage to the membrane 122. Thus, the groove 109 optimizes the separation process.

Figure 1K:
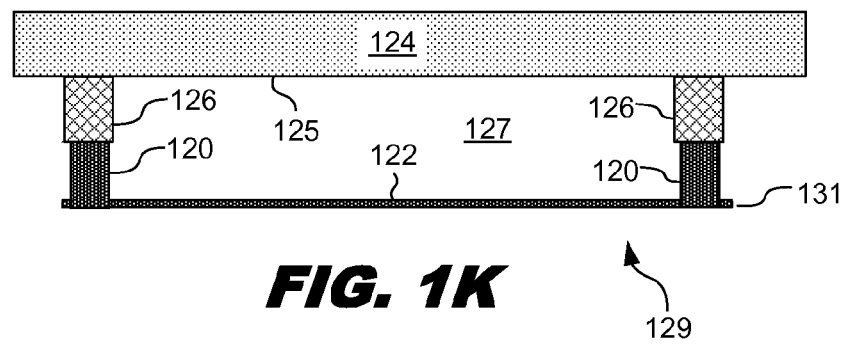

FIG. 1K illustrates the photomask 124 with the pellicle 129 separated from the rest of the pellicle wafer 112 and other structures. The pellicle 129 is a monolithic structure that includes the pellicle membrane 122 and the pellicle membrane support structure 120. Using the above described process, the pellicle 129 also includes a remaining portion 131 of the break-off part 118. The remaining portion 131 of the break-off part 118 is coplanar with the pellicle membrane 122 and extends from the pellicle membrane structure 120 on the opposite side of the pellicle membrane 122. The remaining portions may have a jagged or rough edge resulting from the mechanical breaking of the break-off part 118.

The pellicle 129 can protect the patterned side 125 of the photomask 124 from contaminants that may cause damage. Additionally, the pellicle frame 126 may include features to allow the pellicle to operate more effectively. For example, the pellicle frame may allow air to pass between the protected area 127 and the environment external to the pellicle 129. This is because for some photolithographic processes, the photomask 124 may be placed in a vacuum. If the protected area were hermetically sealed, then the pressure differential between the protected area 127 and the external environment could put harmful stress on the pellicle membrane 122 and may even cause it to break. Additionally, the passageways that allow air to pass between the protected area 127 and the environment external to the pellicle 129 may include a filter to prevent contaminants and other substances from reaching the protected area 127 and thus causing damage to the patterned side 125 of the photomask 124.

With the pellicle 129 attached, the photomask 124 can be used to pattern resist layers for integrated circuit fabrication processes. In one example, Extreme UltraViolet (EUV) light may be directed at the patterned side 125 of the photomask 124. Such light will pass through the pellicle membrane 122. Then, after reflecting off portions of the patterned side 125, the light will again pass through the pellicle membrane 122 and will ultimately reach the resist pattern being exposed.

The above example illustrates the pellicle frame of the photomask being bonded to the pellicle membrane support structure before removing the pellicle membrane from the pellicle wafer. In some examples, however, a mechanical force can be used to disconnect the pellicle membrane and pellicle membrane support structure from the pellicle wafer before the pellicle is attached to the photomask.

Figure 2:
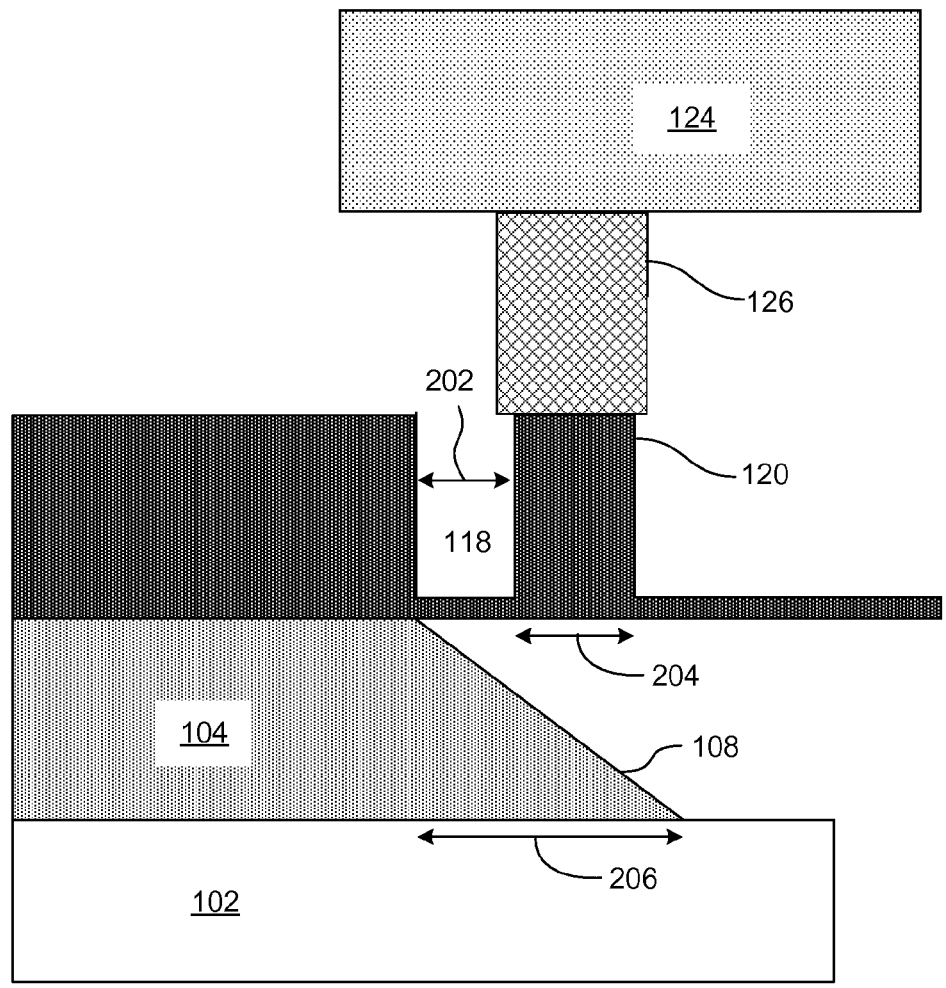
FIG. 2 is a diagram showing illustrative dimensions of a pellicle and other components used to form the pellicle, according to one example of principles described herein.

FIG. 2 is a diagram showing illustrative dimensions of a pellicle 129 and other components used to form the pellicle 129. According to the present example, the width 202 of the break-off part 118 may be within a range of about 1-10 millimeters. The width 204 of the pellicle membrane support structure 120 may be within a range of about 1-10 millimeters. The width 206 of the sloped portion 108 may be within a range of about 2-20 millimeters. The slope of the sloped portion 108 is based on the width 206 of the sloped portion 108 and the thickness of the spacing layer 104. Or, in the case where the indented portion 106 does not extend down to the carrier wafer 102, the slope of the sloped portion 108 is based on the width 206 and the depth of the indented portion 106. As described above, the sloped portions 108 may not be completely linear. These dimensions provide sufficient strength to the pellicle 129 while allowing the break-off part 118 to be effectively broken without damaging the pellicle membrane 122 or pellicle membrane support structure 120.

Figure 3:
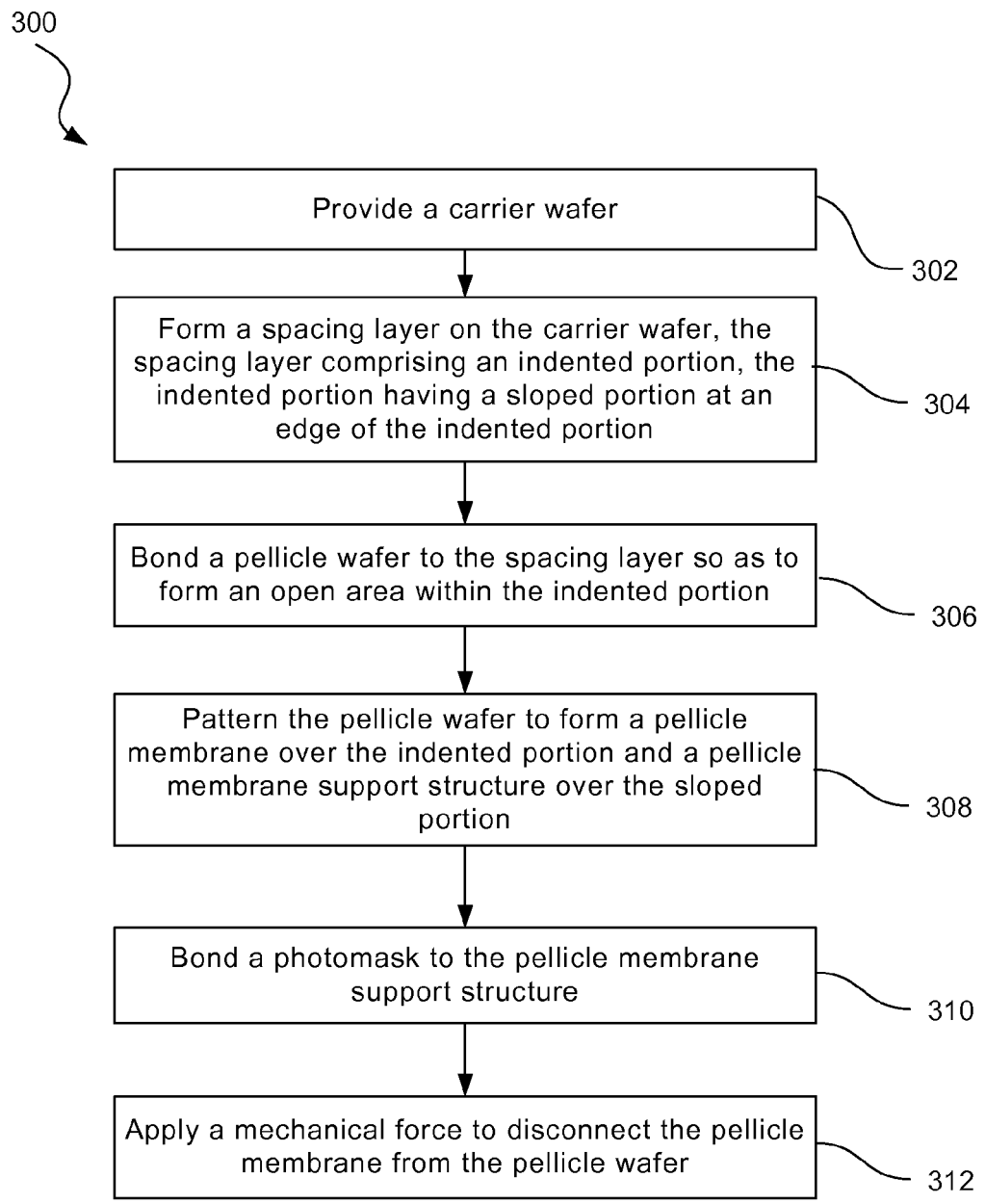
FIG. 3 is a flowchart showing an illustrative method for forming a pellicle for a photomask, according to one example of principles described herein.

FIG. 3 is a flowchart showing an illustrative method for forming a pellicle for a photomask. According to the present example, the method 300 includes a step 302 for providing a carrier wafer (e.g. 102, FIG. 1A). As described above, the carrier wafer is a temporary structure used to support subsequently formed layers.

According to the present example, the method 300 further includes a step 304 for forming a spacing layer (e.g. 104, FIG. 1A) on the carrier wafer, the spacing layer comprising an indented portion (e.g. 106, FIG. 1B), the indented portion having a sloped portion (e.g. 108, FIG. 1B) at an edge of the indented portion. The spacing layer may be deposited using a high density plasma CVD process. The spacing layer may be made of a material such as silicon nitride or silicon oxynitride. The spacing layer can then be patterned to form the indented portion. An etching process can be used to remove portions of the spacing layer so as to create the indented portion. The etching process can also be tuned to create the sloped portions as desired. As described above, the sloped portions may be substantially linear, concave, or convex. During patterning of the spacing layer, a groove may be formed into the spacing layer that extends from the indented portion to the edge of the carrier wafer. The groove acts as an exhaust port to allow air within the indented portion to escape out the sides of the carrier wafer.

According to the present example, the method 300 further includes a step 306 for bonding a pellicle wafer (e.g. 112, FIG. 1D) to the spacing layer so as to form an open area within the indented portion. The pellicle wafer may be made of a semiconductor material such as silicon. The pellicle wafer is the piece of material out of which the pellicle is to be formed.

In some examples, the backside of the carrier wafer may be thinned down. In some cases, the combination of the carrier wafer, spacing layer, and the pellicle wafer may be too thick to fit into some photolithography tools. Thus, the carrier wafer may be thinned down to allow the wafers to fit within the tools that perform the subsequent photolithography processes.

According to the present example, the method 300 further includes a step 308 for patterning the pellicle wafer to form a pellicle membrane (e.g. 122, FIG. 1F) over the indented portion and a pellicle membrane support structure (e.g., 120, FIG. 1F) over the sloped portion. This may be done through various photolithographic techniques. The pellicle membrane is formed by etching away a portion of the pellicle wafer above the indented portion so that a thin membrane remains. The pellicle membrane support structure is formed by etching away portions of the pellicle wafer on both sides of the region of pellicle wafer that is to form the pellicle membrane support structure. The pellicle membrane support structure is formed over the sloped portions.

The method may also include forming a break-off part. The break-off part 118 is positioned between the pelican membrane support structure and the remaining portions of the pellicle wafer. The break-off part may be similar in thickness to the pellicle membrane. As will be described in further detail below, the break-off part are designed to be broken under the application of mechanical pressure in order to disconnect the pellicle membrane and pellicle membrane support structure from the remaining portion of the pellicle wafer. Because the break-off part, pellicle membrane support structure, and pellicle membrane are all formed within the same pellicle wafer, they form a single monolithic structure, which may be referred to as the pellicle.

According to the present example, the method 300 further includes a step 310 for bonding a photomask (e.g. 124, FIG. 1H) to the pellicle membrane support structure. Specifically, the pellicle membrane support structure is bonded to a pellicle frame that is attached to the photomask. Such a bonding may be achieved through use of silicon glue. The pellicle frame may have a rectangular shape from a top perspective. The pellicle frame is positioned to encompass the patterned portion of the photomask. The pellicle membrane support structure may match the shape of the pellicle frame. Specifically, the pellicle membrane support structure may be a rectangular, circuitous feature that matches the size and shape of the pellicle frame. Thus, when bonded to the pellicle frame, the pellicle membrane support structure, pellicle membrane, and pellicle frame provided a protected area above the patterned portion of the photomask.

According to the present example, the method 300 further includes a step 310 for applying a mechanical force to disconnect the pellicle membrane from the pellicle wafer. Specifically, the mechanical force may push the break-off parts against the sloped portions to cause them to break. Then, the pellicle, which includes the pellicle membrane and pellicle membrane support structure, can be removed. Thus, the pellicle creates a protected area over the patterned portion of the photomask.

Using the above described process, the pellicle also includes a remaining portion of the break-off part. The remaining portion of the break-off part is coplanar with the pellicle membrane and extends from the pellicle membrane structure 120 on the opposite side of the pellicle membrane. The remaining portions may have a jagged or rough edge resulting from the mechanical breaking of the break-off part.

Through use of methods described herein, a pellicle can be efficiently formed to protect the patterned portion of a photomask. Thus, the patterned portion of the photomask can be protected from particles and other contaminants. The pellicle can be formed into a pellicle wafer and then mechanically disconnected. Such a technique can efficiently produce an effect pellicle to protect the photomask.

According to one example, a method includes providing a carrier wafer, forming an indented portion on the carrier wafer, the indented portion having a sloped portion at an edge of the indented portion, bonding a pellicle wafer on the carrier wafer so as to form an open area within the indented portion, patterning the pellicle wafer to form a pellicle membrane over the indented portion and a pellicle membrane support structure over the sloped portion, and applying a mechanical force to disconnect the pellicle membrane from the pellicle wafer.

According to one example, a method includes forming an indented portion on a carrier wafer, edges of the indented portion having a sloped portion sloping from a lower portion of the indented portion to a top surface of the spacing layer, bonding a pellicle wafer on the carrier wafer, patterning the pellicle wafer to form a pellicle membrane over the indented portion, a pellicle membrane support structure over the sloped portion, and a break-off part over the sloped portion, applying a mechanical force to break the break-off part and disconnect the pellicle membrane and pellicle membrane support structure from the pellicle wafer.

According to one example, an apparatus includes a photomask having a patterned portion, a pellicle frame connected to the photomask, the pellicle frame substantially encompassing the patterned portion, and a pellicle comprising. A pellicle membrane support structure shaped according to the pellicle frame, a first end of the pellicle membrane support structure being bonded to the pellicle frame, and a pellicle membrane at a second end of the pellicle membrane support structure, the pellicle membrane substantially covering the patterned portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a carrier wafer;
forming an indented portion on the carrier wafer, the indented portion having a sloped portion at an edge of the indented portion;
bonding a pellicle wafer on the carrier wafer so as to form an open area within the indented portion;
patterning the pellicle wafer to form a pellicle membrane over the indented portion and a pellicle membrane support structure over the sloped portion; and
applying a mechanical force to disconnect the pellicle membrane from the pellicle wafer.

2. The method of claim 1, wherein forming the indented portion comprises:
forming a spacing layer on the carrier wafer, and
patterning the spacing layer to form the indented portion.

3. The method of claim 1, wherein patterning the pellicle wafer further comprises forming a break-off part over the sloped portion on an opposite side of the pellicle membrane support structure from the pellicle membrane.

4. The method of claim 1, further comprising, bonding a photomask to the pellicle membrane support structure.

5. The method of claim 4, wherein the photomask comprises a pellicle frame attached thereto, and wherein bonding the photomask to the pellicle membrane support structure comprises bonding the pellicle membrane support structure to the pellicle frame of the photomask.

6. The method of claim 1, wherein forming the spacing layer comprises:
depositing a spacing layer material; and
performing an etching process to form the indented portion.

7. The method of claim 1 wherein the indented portion has a substantially rectangular shape from a top perspective.

8. The method of claim 7, wherein a first dimension of the indented portion is within a range of about 132-137 millimeters and a second dimension of the indented portion is within a range of about 104-110 millimeters.

9. The method of claim 1, further comprising, forming an exhaust port extending from the indented portion to an edge of the carrier wafer.

10. The method of claim 1, further comprising, before patterning the pellicle wafer, thinning down a backside of the carrier wafer.

11. A method comprising:
forming an indented portion on a carrier wafer, edges of the indented portion having a sloped portion sloping from a lower portion of the indented portion to a top surface of the spacing layer;
bonding a pellicle wafer on the carrier wafer;
patterning the pellicle wafer to form a pellicle membrane over the indented portion, a pellicle membrane support structure over the sloped portion, and a break-off part over the sloped portion;
applying a mechanical force to break the break-off part and disconnect the pellicle membrane and pellicle membrane support structure from the pellicle wafer.

12. The method of claim 11, wherein forming the indented portion comprises:
depositing a spacing layer material on a carrier wafer to form a spacing layer on the carrier wafer; and
patterning the spacing layer to form the indented portion.

13. The method of claim 12, wherein a thickness of the spacing layer is within a range of about 500-600 nanometers, and wherein the spacing layer comprises at least one of silicon nitride or silicon oxynitride.

14. The method of claim 11, wherein the break-off part and the pellicle membrane have a same thickness.

15. The method of claim 11, wherein the break-off part comprises a trench within the pellicle wafer, the trench surrounding the pellicle membrane support structure.

16. The method of claim 11, further comprising, bonding a pellicle frame of a photomask to the pellicle membrane support structure.

17. The method of claim 11, wherein bonding the pellicle wafer to the spacing layer comprises a fusion bonding process.

18. An apparatus comprising:
a photomask having a patterned portion;
a pellicle frame connected to the photomask, the pellicle frame substantially encompassing the patterned portion; and
a pellicle comprising:
a pellicle membrane support structure shaped according to the pellicle frame, a first end of the pellicle membrane support structure being bonded to the pellicle frame; and
a pellicle membrane at a second end of the pellicle membrane support structure, the pellicle membrane substantially covering the patterned portion.

19. The apparatus of claim 18, wherein the pellicle membrane support structure and the pellicle membrane form a monolithic structure.

20. The apparatus of claim 18, further comprising, a portion of a break-off part extending from the pellicle membrane support structure and being coplanar with the pellicle membrane.

* * * * *